(12) United States Patent
Moehrlein et al.

(10) Patent No.: US 10,317,574 B2
(45) Date of Patent: Jun. 11, 2019

(54) SYSTEM AND METHOD FOR IDENTIFICATION AND/OR NOWCASTING OF HAIL EVENTS

(71) Applicant: nowcast GmbH, Munich (DE)

(72) Inventors: Matthias Moehrlein, Munich (DE); Silvia Riso, Munich (DE); Hans-Dieter Betz, Schondorf (DE); Daniel Betz, Schondorf (DE)

(73) Assignee: nowcast GmbH, Munich (DE)

( * ) Notice: Subject to any disclaimer, the term of this patent is extended or adjusted under 35 U.S.C. 154(b) by 370 days.

(21) Appl. No.: 15/094,498

(22) Filed: Apr. 8, 2016

(65) Prior Publication Data

US 2016/0299257 A1 Oct. 13, 2016

(30) Foreign Application Priority Data

Apr. 10, 2015 (EP) ..................... 15001019

(51) Int. Cl.
| | | |
|---|---|---|
| *G01R 29/08* | (2006.01) | |
| *G01W 1/10* | (2006.01) | |
| *G01W 1/14* | (2006.01) | |
| *G01W 1/16* | (2006.01) | |

(52) U.S. Cl.
CPC ........... *G01W 1/10* (2013.01); *G01R 29/0842* (2013.01); *G01W 1/14* (2013.01); *G01W 1/16* (2013.01)

(58) Field of Classification Search
None
See application file for complete search history.

(56) References Cited

U.S. PATENT DOCUMENTS

2007/0213843 A1* 9/2007 Jantunen ............ H04B 1/1027
700/11

FOREIGN PATENT DOCUMENTS

| DE | 102004000025 A1 | 3/2006 |
|---|---|---|
| WO | 2013006259 A1 | 1/2013 |

OTHER PUBLICATIONS

Williams, E. et al., "The Behavior of Total Lightning Activity in Severe Florida Thunderstorms," Atmospheric Research, vol. 51, No. 3-4, Jul. 1999, 21 pages.

(Continued)

*Primary Examiner* — Cheung Lee
(74) *Attorney, Agent, or Firm* — McCoy Russell LLP (57) ABSTRACT

A system for identification and/or nowcasting of hail events with several measuring stations for detecting signals related to electromagnetic radiation in connection with lightning may comprise at least one time measuring unit for detecting the temporal course of the detected signals, and at least one analysis unit interconnected with the measuring stations and the time measuring unit. The analysis unit may comprise at least a first lightning signal analysis module for generation of a lightning signal analysis based on the detected signals, and a second lightning signal analysis module for identification of at least one lightning jump event based on the temporal course of the detected signals and the lightning signal analysis. The analysis unit may further comprise a nowcasting module for nowcasting concerning a hail event based on a lightning jump event. Furthermore, a method for identification and/or nowcasting of hail events is described.

13 Claims, 7 Drawing Sheets

(56) References Cited

OTHER PUBLICATIONS

Gatlin, P. et al., "A Total Lightning Trending Algorithm to Identify Severe Thunderstorms," Journal of Atmospheric and Oceanic Technology, vol. 27, No. 1, Jan. 2010, 20 pages.
Yao, W. et al., "Characteristics of Lightning Activities in the Hailstorm Using the Data from Two Types of Lightning Detection Network," Proceedings of the 4th International Lightning Meteorology Conference (ILMC 2012), Apr. 4, 2012, Broomfield, Colorado, 9 pages.

* cited by examiner

SYSTEM AND METHOD FOR IDENTIFICATION AND/OR NOWCASTING OF HAIL EVENTS

CROSS REFERENCE TO RELATED APPLICATIONS

The present application claims priority to European Patent Application No. 15001019.7, filed on Apr. 10, 2015, the entire contents of which are hereby incorporated by reference for all purposes.

TECHNICAL FIELD

The present invention refers to a system and method for identification and/or nowcasting of hail events.

BACKGROUND AND SUMMARY

Occurrence of hail may cause severe damage e.g. of buildings and vehicles and, in the worst case, endangering of human life. Thus, there is considerable interest, e.g., to be able to warn in time before occurrence of hail.

DE 10 2004 000 025 A1 describes a system for detection, transmission, and analysis of data and information arising from electromagnetic radiation. This system allows for precise characterization of e.g. cloud-to-ground lightning and in-cloud lightning inside a cloud or between clouds. This enables three-dimensional locating of impulse emissions of natural and/or non-natural origin, e.g. locating of lightning, charge transfers, charge emissions or similar effects by low-frequency networks (so-called very-low-frequency networks or VLF networks). Electromagnetic waves in the frequency range 3-30 kHz (very-low frequency, or VLF) are named long-waves. In this connection there is no need to utilize frequencies in the radio or VHF regime (very high frequency, or VHF).

\WO 2013/006259 A1 describes a severe weather warning system that analyses data in connection with lightning activity and determines location, propagation velocity, propagation direction, and lightning rate of one or more cells with lightning activity. Then, the lightning rate is compared with a threshold value and one or more geographical areas are determined on the basis of location, propagation velocity, and propagation direction of thunderstorm cells.

The connection between occurrence of thunderstorms and hail events is already known. However, as is also generally known, one cannot expect hail events from each thunderstorm at the same time.

It is, thus, the object of the present invention to develop in an advantageous manner a system for identification and/or nowcasting of severe weather of the above-mentioned type, e.g. in such a way that hail events can be predicted with higher precision.

This object is solved according to the present invention by way of a system for identification and/or nowcasting of hail events which comprises several measuring stations for detection of signals related to electromagnetic radiation in connection with lightning, as well as at least one unit for time measurement in order to capture the time course of recorded signals, at least one analysis unit that is connected with the measuring stations and the unit for time measurement, whereby the analysis unit comprises at least one first module for lightning signals, based on the recorded signals, suited for generation of a lightning signal analysis comprising data related to lightning activity and/or quantity of lightning, and/or lightning intensity, and/or location, and/or propagation direction, and/or propagation velocity of the lightning, whereby the analysis unit comprises a second lightning analysis module for identification of at least one lightning jump event as based on the lightning signal analysis, and the analysis unit comprises a nowcasting module for the prediction of a hail event as derived from a lightning jump event.

The invention is based on the idea to check specific data related to thunderstorms with respect to occurrence of events that can be closely related to occurrence of hail. An event of this type is, for example, the occurrence of a so-called lightning jump. Here, the notation lightning jump may refer to an event that features an (strong) increase of lightning activity and/or an (strong) increase of emission altitudes at a certain time (and at a certain location). Based on such a lightning jump event the occurrence of hail can be nowcasted with high probability. Thus, when one uses a system for lightning location, e.g. the system described in DE 10 2004 000 025 A1, in conjunction with a three-dimensional system for lightning analysis and lightning location, and examines additionally the data received from this system with respect to occurrence of lightning jumps, occurrence of hail events can be nowcasted with very high precision. The lightning signal analysis can be a three-dimensional one. In this connection, both cloud-to-ground lightning and cloud-to-cloud lightning or in-cloud lightning can be analysed.

Registration of the current thunderstorm situation is made by measuring presently occurring lightning "strikes". Measurement of strikes proceeds by recording electromagnetic radiation of strikes at measuring stations, and providing the strikes with a precise time-stamp by means of the time-measuring unit, e.g. with about 10 nanoseconds accuracy, and transmitting continuously to the analysis unit. Based on a TOA (Time-Of-Arrival) procedure, the exact position of a single strike can be determined from signals by the lightning signal analysis module. Hereby, in-cloud (IC) lightning and cloud-to-ground (CG) lightning can be distinguished.

The measuring stations can be configured, for example, as a measuring network and, e.g. can comprise more than 100 highly sensitive sensors in Europe. It would be feasible to utilize the measuring network 'LINET' of nowcast GmbH.

A total lightning ("flash") is usually composed of several strikes of lightning. Using the so-called strikes-to-flashes algorithm the strikes are condensed to flashes. A flash can exhibit a combination of IC (in-cloud) strikes and CG (cloud-to-ground) strikes. Clusters of flashes and strikes (temporal and spatial) can be merged into a lightning cell. Computation of cells can be accomplished in regular time intervals or continuously. In this way, the propagation of the cell can be determined. Cells can split or merge, or dissolve.

During the three-dimensional lightning signal analysis, all lightning that occurs e.g. within a time period and within a certain three-dimensional space are determined with respect to lightning activity, quantity of lightning, lightning intensity, lightning location, direction of propagation (of the lightning cell), and velocity of propagation of the lightning or lightning cell.

In addition it can be conceived that the lightning signal analysis comprises data with respect to lightning activity, and/or quantity of lightning or lightning intensity, and/or lightning strength, and/or lightning location, and/or direction of propagation, and/or velocity of propagation of the lightning. Based on data with respect to the lightning activity, quantity of lightning, lightning intensity, lightning strength, location, direction of propagation, and/or velocity of propagation of the lightning, a lightning jump event can be determined, taken individually, or more precisely in combination with the second lightning signal analysis module.

Thereby, the lightning jump event is not only deduced via temporal and spatial accumulation of lightning, but based on the data that enters into the lightning signal analysis, it shall be enabled that at least one lightning jump event on the basis of an existing gradient exists, whereby the gradient results from the data that enters into the lightning signal analysis.

In particular, it can be further conceived that the lightning signal analysis comprises data with respect to in-cloud lightning and cloud-to-ground lightning. These data concerning in-cloud and cloud-to-ground lightning are related with the existence of a lightning jump event and can be used for a more precise identification of such a lightning jump event.

In addition, it is possible that the lightning signal analysis comprises data with respect to the altitude of lightning, e.g. an altitude distribution of the lightning. Consideration of the altitude of lightning, e.g. by consideration of an altitude distribution of lightning, facilitates verification of the existence of gradients, pointing to the existence of a lightning jump event with respect to rate and/or altitude.

Data concerning altitude distribution of lightning may comprise e.g. data regarding the emission altitudes of lightning.

In particular, it may be data from which is deducible whether an (strong) increase of emission altitudes of in-cloud lightning has arisen or not.

Moreover, it can be conceived that the second lightning signal analysis module comprises at least one first comparison element and at least one second comparison element, whereby both the first and the second comparison element are configured to determine a lightning jump event independent of each other, and the second lightning signal analysis module is configured to determine a lightning jump event for the case that both comparison elements determine a lightning jump event.

In this way it becomes possible to deduce existence of a lightning jump event only in the case when two independent identification methods and identification elements in terms of the first and second comparison elements lead to the result that a lightning jump event has occurred. In this way the sensitivity of the identification of hail events can be improved.

Furthermore it can be conceived that coordinates of the lightning jump event can be determined on the basis of the second lightning signal analysis module using the time coordinates of the location of the lightning jump. It is possible, e.g., that using the time-of-arrival (TOA) procedure described in DE 10 2004 000 025 A1, the time coordinates of lightning allow determination of spatial coordinates of lightning, thereby enabling deduction of the spatial coordinates of the lightning jump event based on a determination of the time coordinates of the lightning jump event.

Furthermore, it is possible that using the second lightning signal analysis module and based on the determined spatial coordinates of the lightning jump event at least one area of probable hail occurrence is identified. Due to identification of an area of probable hail occurrence it becomes feasible to generate a specific warning with respect to probable hail occurrence.

In addition, it is possible that using the second lightning signal analysis module and additional signals related to lightning within a time period after the lightning jump event, an area with possible hail occurrence can be identified. It is possible, e.g., to deduce an area with possible hail occurrence, based on time and spatial distribution of lightning, spatial coordinates of the lightning jump event, propagation direction, and propagation velocity. In this connection, a rough estimate can be used, that starting with the identification of a time t=0 minutes, a possible area with hail occurrence becomes probable, e.g. at the location to which the corresponding thunderstorm cell with the at least one lightning jump event will have moved to after about 8 to 12 minutes, e.g. after about 10 minutes.

Furthermore, the present invention relates to a method for identification and/or nowcasting of severe thunderstorms. Accordingly, the method comprises at least the following steps:
  detecting signals that are related to electromagnetic radiation in connection with lightning;
  detecting the time course of the detected signals;
  based on the detected signals, performing a lightning signal analysis that is based on data related to lightning activity, lightning quantity, lightning intensity, lightning emission altitude, lightning location, lightning propagation direction, and/or lightning propagation velocity of;
  based on the lightning signal analysis, identifying at least one lightning jump event, and based on a lightning jump event, generating a nowcasting concerning a hail event.

All structural and functional features, either by themselves or in combinations, related to the above-described system according to the present invention in all its possible forms of realization, can be also used according to the method described in the invention in order to achieve the related advantages.

Furthermore, it can be conceived that the lightning signal analysis comprises data related to lightning activity, lightning quantity, lightning intensity, lightning strength, lightning location, lightning direction of propagation, velocity of propagation of the lightning, in-cloud lightning, cloud-to-ground lightning, data related to the altitude of lightning, e.g. an altitude distribution of lightning.

Moreover, it can be conceived that a lightning jump event is determined at least with two different kinds of determination independently of each other, respectively, and that a lightning jump event is determined only when both kinds of determination determine the presence of a lightning jump event.

In addition, it is conceivable that based on time coordinates of the lightning jump location the coordinates of the lightning jump event are determined.

Furthermore, it is conceivable that using the second lightning signal analysis module and based on the determined spatial coordinates of the lightning jump event at least one probable area for hail occurrence is identified.

Furthermore, it is conceivable that a probable area with hail occurrence is additionally identified on the basis of signals related to lightning that occurs within a time period after the lightning jump event.

BRIEF DESCRIPTION OF THE FIGURES

Further details and advantages of the invention shall be explained in more detail by means of an example for execution shown in the following figures:
  It is shown in.

DETAILED DESCRIPTION

Figure 1:
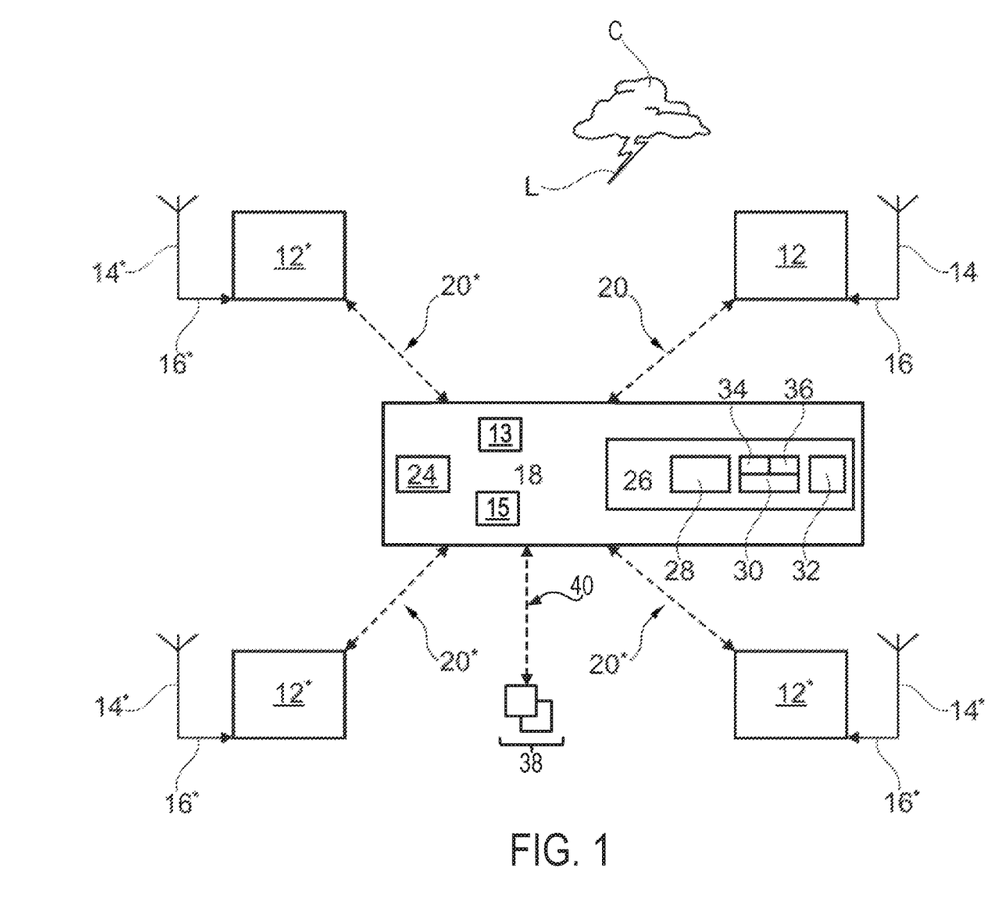
FIG. 1: a schematic representation of an execution example of a system configured to perform the method of the present invention.

FIG. 1 shows in a schematic representation a system 10 for identification and nowcasting of hail events with several measuring stations 12, 12*, whereby the measuring stations 12, 12* detect signals related to electromagnetic radiation in connection with lightning.

Each of the measuring stations 12, 12* comprises at least one antenna unit 14, 14* and at least one data transmission means 16, 16*. The at least one antenna unit 14, 14* can transmit raw data from lightning L by way of the respective measuring station 12, 12* that comprises the appropriate data transmission means 16, 16*.

The system 10 further comprises at least one central station 18 that is connected with each individual measuring station 12, 12* via a corresponding data link 20, 20*. Central station 18 comprises a processor 13 and non-transitory memory 15 storing instructions executable by the processor to perform the various control actions described herein. In some non-limiting examples, each of the units and modules of central station 18 may include a processor and non-transitory memory storing instructions, whereas in other non-limiting examples, the units and modules may each include instructions which are stored in non-transitory memory 15 and executable by processor 13 of central station 18.

The central station 18 further comprises a time measurement unit 24 for recording the time course of signals detected with measuring stations 12, 12*. For example, time measurement unit 24 may include instructions stored in non-transitory memory and executable by a processor for recording the time course of the signals detected with measuring stations 12, 12*. Alternatively or additionally, each single measuring station 12, 12* may comprise a corresponding time measurement unit 24.

Furthermore, the central station 18 features at least one analysis unit 26.

The analysis unit 26 comprises a first lightning signal analysis module 28 for generation of a lightning signal analysis on the basis of signals detected by measuring stations 12, 12*. For example, the first lightning signal analysis module 28 may include instructions stored in non-transitory memory and executable by a processor for generating a lightning signal analysis on the basis of signals detected by measuring stations 12, 12*.

Moreover, the analysis unit 26 features a second lightning signal analysis module 30 for identification of at least one lightning jump event derived from the recorded time course of the signals and the related lightning signal analysis. For example, the second lightning signal analysis module 30 may include instructions stored in non-transitory memory and executable by a processor for identifying at least one lightning jump event derived from the recorded time course of the signals and the related lightning signal analysis (e.g., the lightning signal analysis generated by the first lightning signal analysis module), and identifying at least one area of probable hail occurrence based on the at least one lightning jump event (e.g., based on determined spatial coordinates of the lightning jump event).

The analysis unit 26 further comprises a nowcasting module 32 for nowcasting of a hail event based on a lightning jump event. For example, the nowcasting module 32 may include instructions stored in non-transitory memory and executable by a processor for transmitting a nowcast of a hail event to one or more recipients 38 over a network 40 based on the at least one area of probable hail occurrence identified by the second lightning signal analysis module. The one or more recipients 38 may include computing devices, such as servers and personal mobile devices, and network 40 may include wireless and/or wired networks, such as the Internet.

The second lightning analysis module 30 further features at least one first comparison element 34 and at least one second comparison element 36. The first and second comparison elements 34, 36 may include instructions stored in non-transitory memory and excecutable by a processor for detecting of a lightning jump independent of each other. An occurrence of a lightning jump event may be identified (e.g., confirmed) by the second lightning signal analysis module 30 when both (or all) comparison elements determine a lightning jump event.

In system 10 the analysis unit 26 features a separate storage (e.g., separate non-transitory memory) where information with respect to measuring stations 12, 12* is stored, such as their spatial coordinates.

The time measuring unit 24 can, for example, be realized by a time measuring unit that uses a highly precise GPS time basis.

In view of the precise set up and functionality of system 10, DE 10 2004 000 025 A1 describes an example of the basic structural and functional layout of a lightning location system for so-called three-dimensional lightning location, and can serve as a technical basis for the system according to the present invention for identification and/or nowcasting of hail events. According to the present invention, additional features are implemented, namely that the analysis unit 26 comprises a second lightning signal analysis module 30 for identification of at least one lightning jump event, based on the temporal or time course of detected signals and the lightning signal analysis performed by first lightning signal analysis module 28, and that the analysis unit 26 features a nowcasting module 32 for nowcasting of hail events on the basis of a lightning jump.

According to the invention, identification and nowcasting of hail events is achieved as follows:

In a first step, signals are detected (e.g., at measuring stations 12, 12*) that relate to electromagnetic radiation in connection with lightning L. FIG. 1 shows an exemplary lightning L from a cloud C.

Thereafter, the time course of the detected signals is detected.

Then, based on the signals and the detected time course of the signals, a lightning signal analysis is generated comprising at least data with respect to lightning activity, lightning quantity, lightning intensity, location, direction of propagation, and propagation velocity of the lightning.

Furthermore, the lightning signal analysis utilizes data with respect to in-cloud lightning and cloud-to-ground lightning. In some examples, the ratio between in-cloud lightning and cloud-to-ground lightning is considered in the lightning signal analysis.

In addition, the lightning signal analysis utilizes data with respect to the altitude of lightning, e.g., the altitude distribution of lightning.

Figure 2:
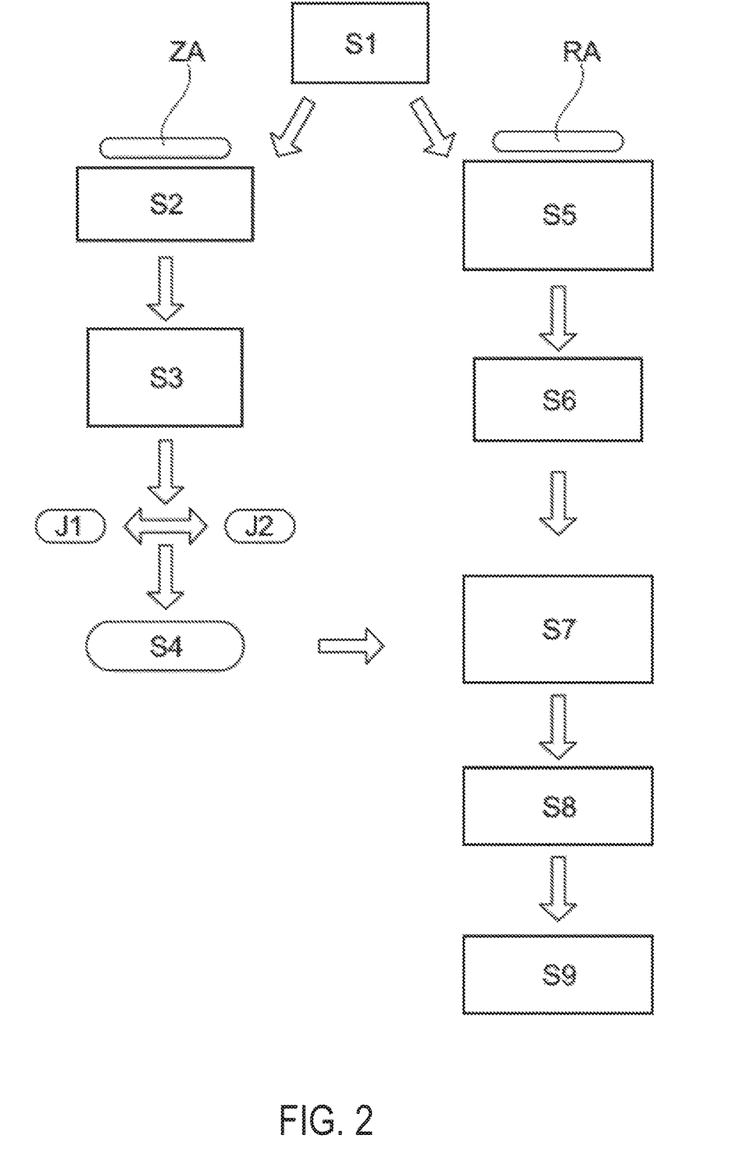
FIG. 2: a flow diagram of the method in line with the present invention.

FIG. 2 shows a schematic flow diagram of the method according to the present invention, as it can be applied in a system that is in line with the present invention.

In Step S1 the raw data that enters into the lightning signal analysis are collected (e.g., via the at least one antenna unit 14, 14*) and supplied to the central station (e.g., central station 18) for evaluation, whereby in steps S2, S3, and S4 a temporal analysis ZA of this data is performed.

In step S2 a histogram is produced that displays the time course of the lightning rate.

In step S3 a search for a lightning jump event is performed.

In step S4 the lightning jump events are assigned to time coordinates. The lightning jump events determined in step 3 are depicted in FIG. 2 by J1 and J2.

In steps S5, S6, and S7 a spatial analysis RA is carried out.

In step S5 a raster matrix is used to generate a lightning density map.

Furthermore, step S6 serves to determine the path of the storm which moves clouds associated with the corresponding lightning.

Step S7 puts the lightning jump event in context with coordinates of the degree of latitude and longitude, in order to determine the spatial and temporal characteristics of the lightning jump event in connection with the time coordinates.

Then, in step S8, area(s) where lightning jump events have occurred are identified.

Based on the determined area(s), step S9 includes identifying an area G where a hail event can be expected to occur with high probability.

Figure 3:
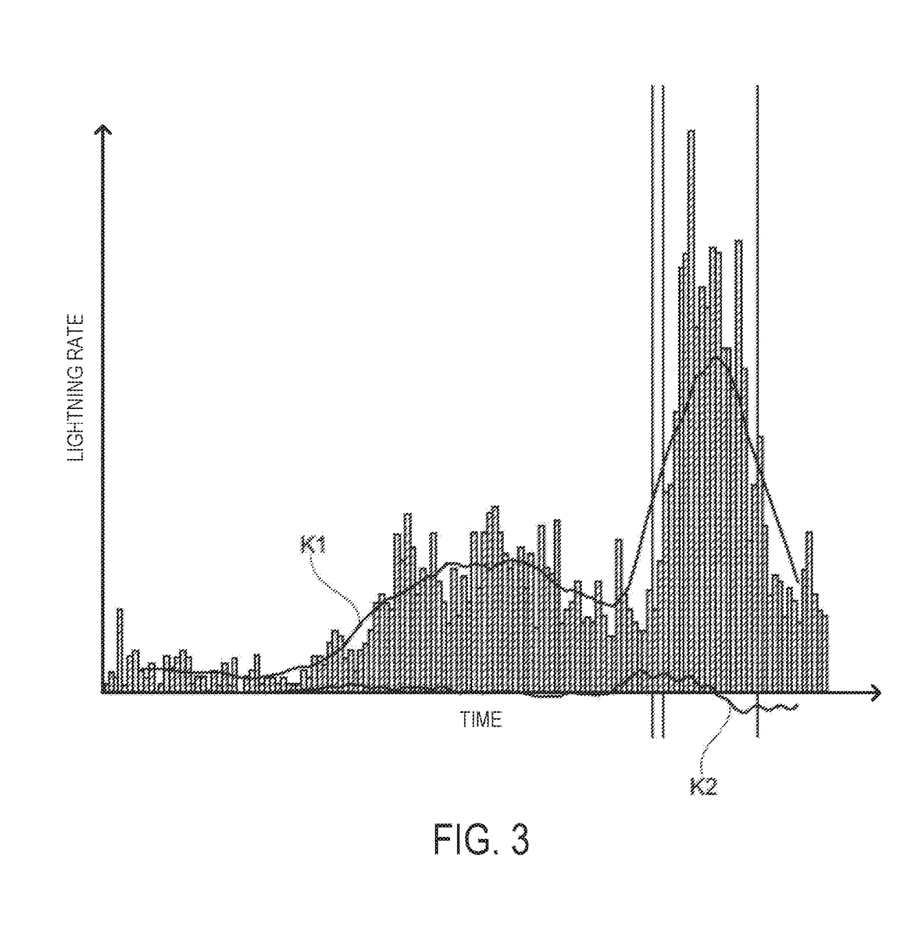
FIG. 3: a histogram representing a first step of the analysis of detected lightning to identify a lightning jump event.
Figure 4:
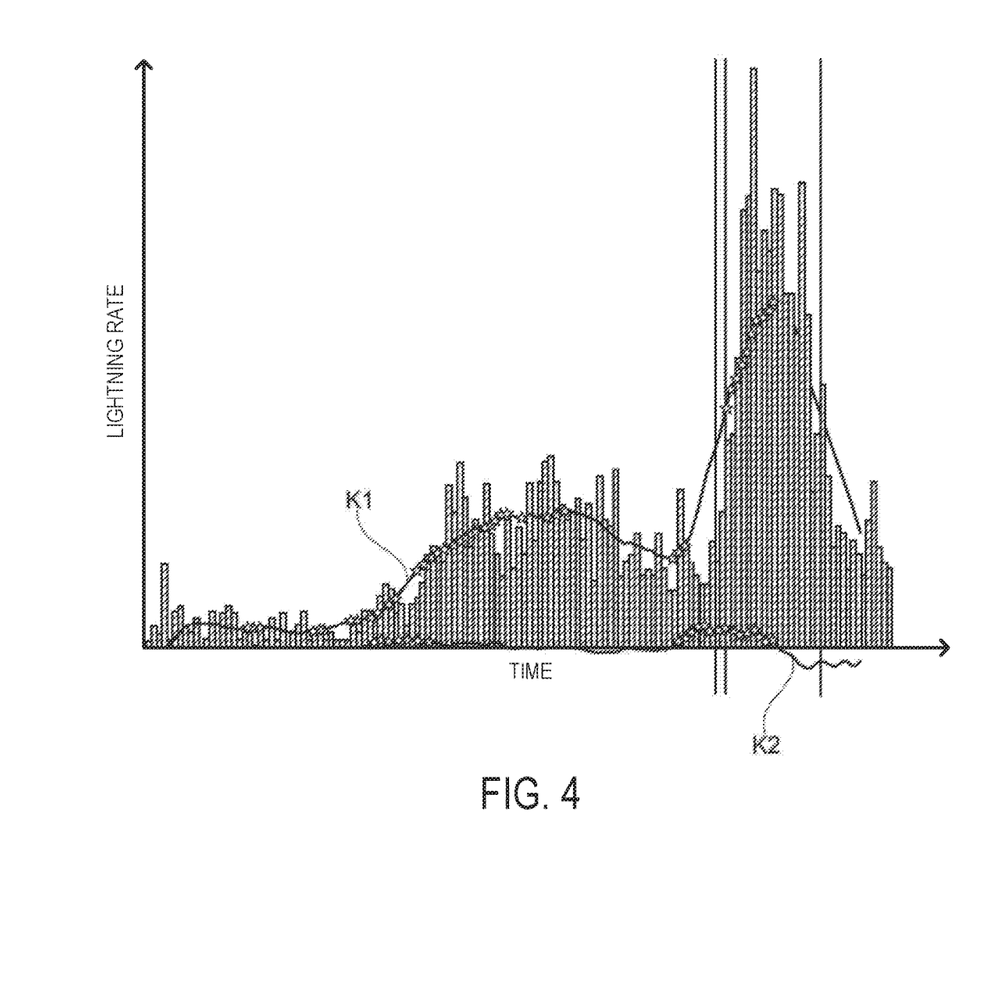
FIG. 4: a histogram representing the analysis of lightning events by two different kinds of determination.
Figure 5:
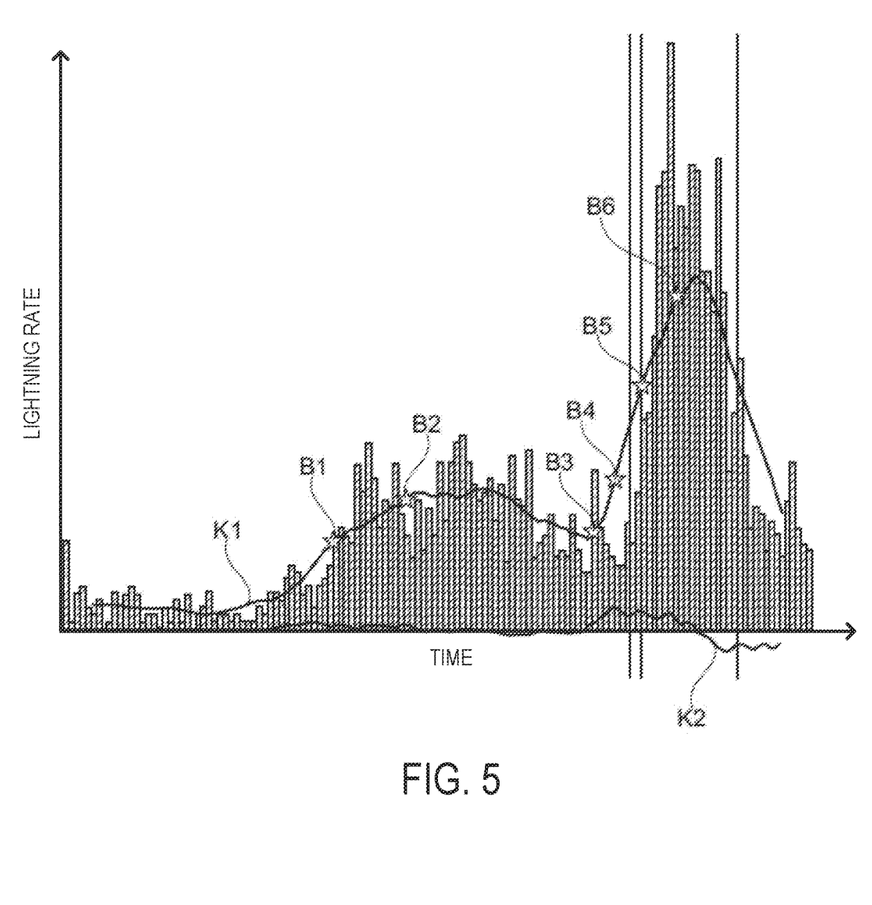
FIG. 5: the determination of lightning jump events via different analysis methods.

FIGS. 3-5 show histograms of the lightning rate per minute of a storm. In FIGS. 3-5, the X-axis represents time, and the Y-axis represents lightning rate.

As shown in FIG. 3, two curves are plotted. Curve K1 represents the average value of the lightning rate per time unit. Curve K2 depicts the gradient that relates to the lightning rate.

FIG. 4 shows the curves K1 and K2, with stars marking the identified maximum values of respective curves K1, K2 that signify potential lightning jump events.

As shown in FIG. 5, only at those positions in the two curves K1, K2 where the occurrence of a potential lightning jump event can be deduced, respectively, a lightning jump event B1, B2, B3, B4, B5, and B6 is actually expected.

Figure 6:
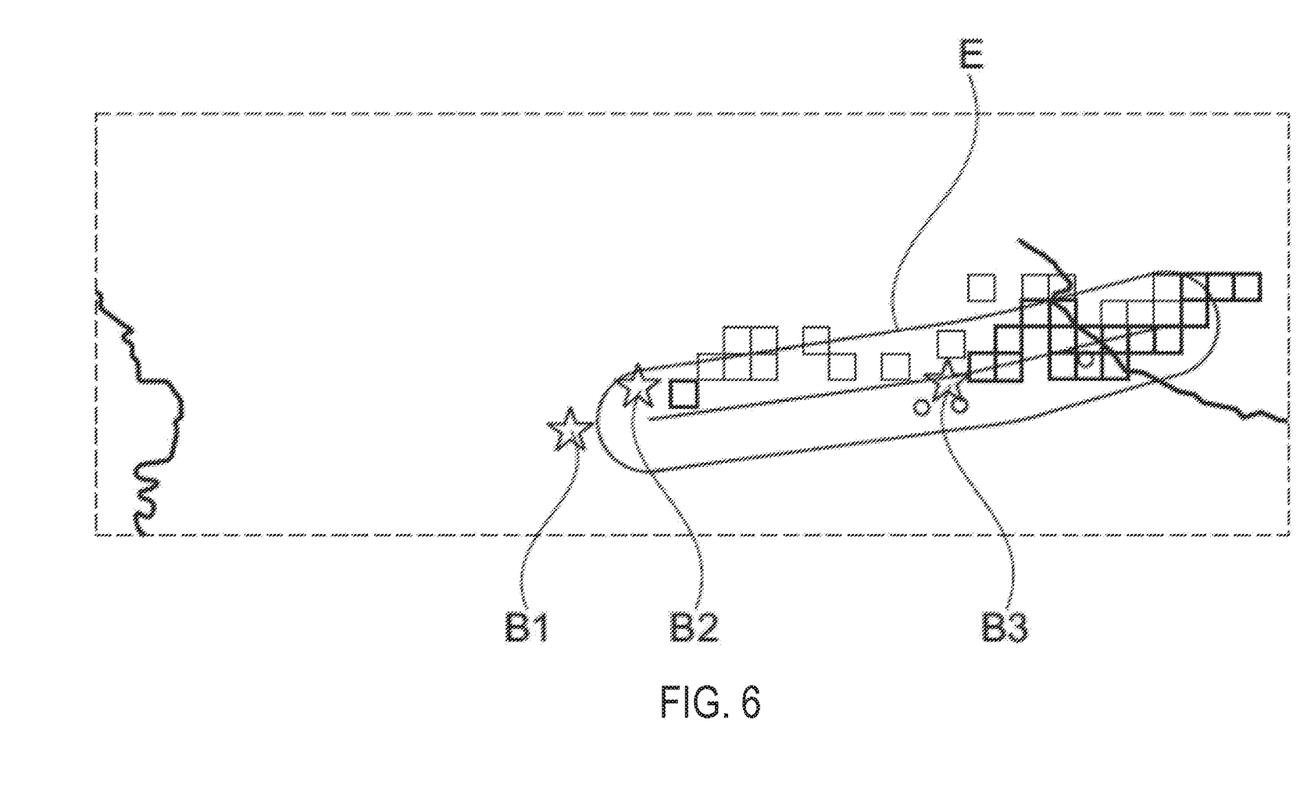
FIG. 6: the schematic representation of the transmission of determined results, according to FIG. 5, with geographical data, here a geographical map.

FIG. 6 shows the result determined from FIG. 5 (see also FIG. 2 and steps S3, S4, and S7) in a map, where lightning jump events B1, B2, and B3 are plotted in space and time.

The identification of lightning jump events may also be based on emission altitudes of in-cloud lightning. For example, a lightning jump event may be defined when an (strong) increase of lightning activity (e.g., an increase of lightning activity greater than a threshold) and/or an (strong) increase of emission altitudes of in-cloud lightning (e.g., an increase of emission altitudes of in-cloud lightning greater than a threshold) occur.

Towards such events the present raw data are specifically searched or analysed accordingly. Therefore, the accuracy relating to the determination of lightning jump events can be increased substantially.

Optionally, such events will be searched where both an (strong) increase of lightning activity (e.g., an increase of lightning activity greater than a threshold) and an (strong) increase of emission altitudes of in-cloud lightning (e.g., an increase of emission altitudes greater than a threshold) occur.

FIG. 6 shows the map for the time $t_o$=n minutes.

Since a hail event occurs according to experience with a certain time delay after a lightning jump event B1, B2, and B3, it becomes feasible to implement a time correction factor k=m minutes, e.g. k=10 minutes.

Figure 7:
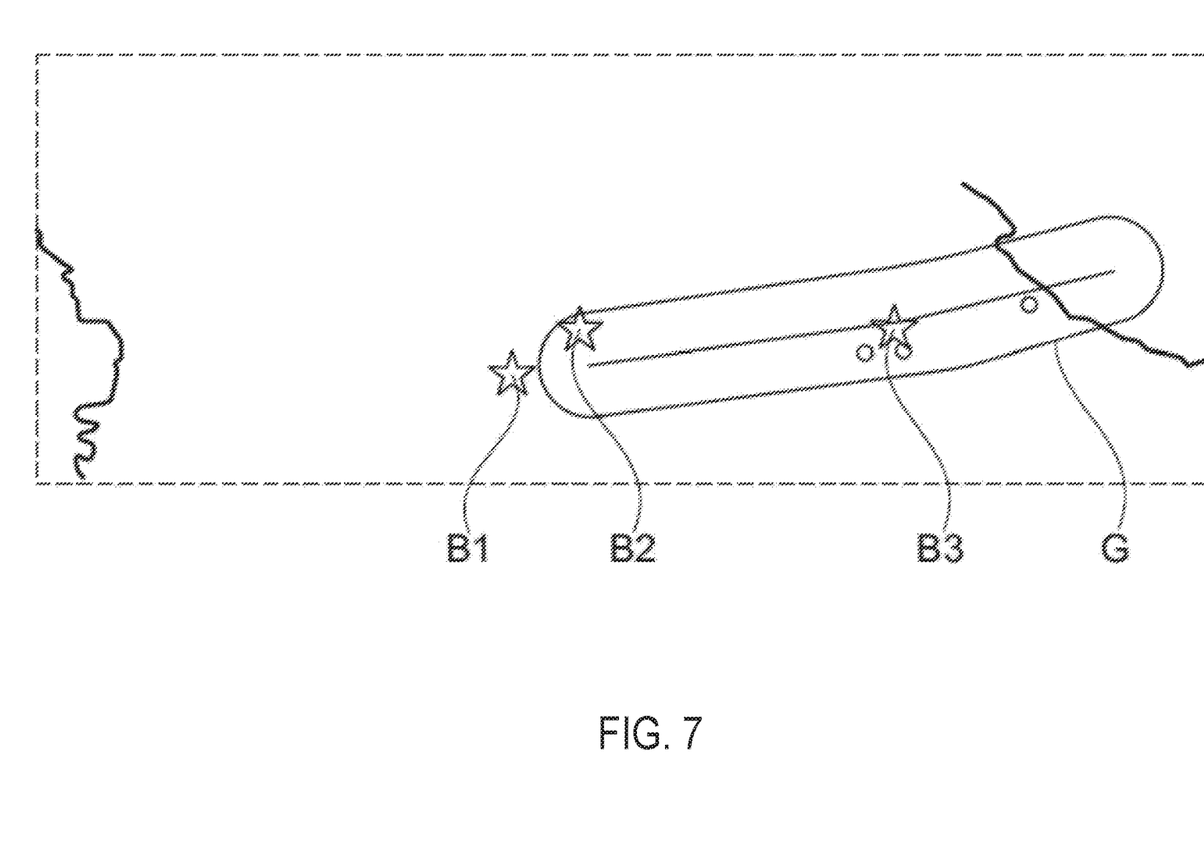
FIG. 7: the schematic representation of a map, corrected by time effects according to FIG. 6, with identification of an area where a hail event becomes probable.

FIG. 7 shows the map as derived from FIG. 6 for the time $t_1$=n+k, which means in the present example $t_1$=n+10 minutes, whereby based on the propagation direction of the storm path (see FIG. 2, step S6), the propagation direction of the clouds that are related to the lightning jump event B1, B2, and B3 are taken into account. Consequently, the so-called area E with a lightning jump event visible from FIG. 6 allows definition of an area G where high probability for a hail event is expected (see also FIG. 2, step S9). An area of this type is also denoted as probable hail-event area G.

The invention claimed is:

1. A system for identification and/or nowcasting of hail events, comprising:
   a plurality of measuring stations configured to detect signals concerning electromagnetic radiation in connection with lightning;
   a central station connected with each individual measuring station via a corresponding data link, the central station comprising a processor and non-transitory memory and further comprising:
      at least one time measuring unit comprising instructions stored in the non-transitory memory and executable by the processor to detect a temporal course of the signals detected at the measuring stations; and
      at least one analysis unit interconnected with the measuring stations and the time measuring unit, the at least one analysis unit comprising a first lightning signal analysis module comprising instructions stored in the non-transitory memory and executable by the processor to generate a lightning signal analysis based on the detected signals, a second lightning signal analysis module comprising instructions stored in the non-transitory memory and executable by the processor to identify at least one lightning jump event based on the temporal course of the signals detected at the measuring stations and the lightning signal analysis, and a nowcasting module comprising instructions stored in the non-transitory memory and executable by the processor to identify a probable hail event based on the at least one lightning jump event, the lightning signal analysis comprising data concerning an altitude of the lightning, including an altitude distribution of the lightning, an emission altitude of cloud lightning being included in the identification of the lightning jump event, and the lightning jump event being defined as an event in which there is a sharp increase in lightning activity and/or a sharp increase in the emission altitude of cloud lightning, and transmit a nowcast concerning the probable hail event over a network to one or more recipients.

2. The system of claim 1, wherein the lightning signal analysis comprises data concerning lightning activity, lightning quantity, lightning intensity, lightning strength, lightning location, direction of propagation of lightning, and/or velocity of propagation of lightning.

3. The system of claim 1, wherein the lightning signal analysis comprises data concerning cloud lightning and ground lightning.

4. The system of claim 1, wherein the second lightning signal analysis module further comprises instructions stored in the non-transitory memory and executable by the processor to:
independently determine whether a lightning jump event has occurred with each of at least one first comparison element and at least one second comparison element; and
identify a lightning jump event only when all of the first and second comparison elements determine that a lightning jump event has occurred.

5. The system of claim 4, wherein the second lightning signal analysis module further comprises instructions stored in the non-transitory memory and executable by the processor to determine spatial coordinates of the lightning jump event based on temporal coordinates of the lightning jump event.

6. The system of claim 5, wherein the second lightning signal analysis module further comprises instructions stored in the non-transitory memory and executable by the processor to identify at least one area with probable hail occurrence based on the determined spatial coordinates of the lightning jump event.

7. The system of claim 5, wherein the second lightning signal analysis module further comprises instructions stored in the non-transitory memory and executable by the processor to identify an area with possible hail occurrence based on signals related to lightning detected during a time period after the lightning jump event.

8. A method for identification and/or nowcasting of hail events, comprising:
capturing signals concerning electromagnetic radiation in connection with lightning;
detecting a temporal course of the captured signals;
based on the captured signals, generating a lightning signal analysis comprising data concerning lightning activity, lightning quantity, lightning strength, emission altitude of lightning, lightning location, direction of propagation of lightning, and/or velocity of propagation of lightning;
on the basis of the lightning signal analysis, identifying at least one lightning jump event;
identifying a probable hail event based on the at least one lightning jump event, the lightning signal analysis data concerning an altitude of the lightning, in particular an altitude distribution of the lightning, an emission altitude of cloud lightning being included in the identification of the lightning jump event, and the lightning jump event being defined as an event in which there is a sharp increase in lightning activity and/or a sharp increase in the emission altitude of cloud lightning; and
transmitting a nowcast concerning the hail event via a network to one or more recipients.

9. The method of claim 8, wherein the lightning signal analysis comprises data concerning lightning intensity, cloud lightning, and/or ground lightning.

10. The method of claim 8, wherein identifying at least one lightning jump event on the basis of the lightning signal analysis comprises independently determining whether a lightning jump event has occurred via at least two different kinds of determination, and identifying a lightning jump event only when all of the at least two kinds of determination indicate that a lightning jump event has occurred.

11. The method of claim 10, further comprising determining spatial coordinates of the lightning jump event on the basis of temporal coordinates of the lightning jump event.

12. The method of claim 11, further comprising identifying at least one area with probable hail occurrence based on the determined spatial coordinates of the lightning jump event.

13. The method of claim 10, further comprising identifying an area with possible hail occurrence on the basis of signals concerning lightning in a time period after the lightning jump event.

* * * * *